United States Patent
Chen et al.

(10) Patent No.: US 11,757,416 B2
(45) Date of Patent: Sep. 12, 2023

(54) MATCHING CIRCUIT

(71) Applicant: RichWave Technology Corp., Taipei (TW)

(72) Inventors: Chih-Sheng Chen, Taipei (TW); Yun-Jhu Lai, Taipei (TW)

(73) Assignee: RichWave Technology Corp., Taipei (TW)

(*) Notice: Subject to any disclaimer, the term of this patent is extended or adjusted under 35 U.S.C. 154(b) by 372 days.

(21) Appl. No.: 17/219,902

(22) Filed: Apr. 1, 2021

(65) Prior Publication Data

US 2022/0038063 A1 Feb. 3, 2022

(30) Foreign Application Priority Data

Jul. 28, 2020 (TW) ................ 109125409

(51) Int. Cl.
*H03F 1/56* (2006.01)
*H03H 7/38* (2006.01)
*H03F 3/195* (2006.01)

(52) U.S. Cl.
CPC .............. *H03F 1/56* (2013.01); *H03F 3/195* (2013.01); *H03F 2200/105* (2013.01); *H03F 2200/318* (2013.01); *H03F 2200/451* (2013.01)

(58) Field of Classification Search
CPC .............. H03H 7/38; H03F 1/56; H03F 3/195
USPC ........................................ 333/32
See application file for complete search history.

(56) References Cited

U.S. PATENT DOCUMENTS

| | | | |
|---|---|---|---|
| 8,207,798 B1 | 6/2012 | Wright | |
| 9,294,050 B2* | 3/2016 | Mostov | B82Y 40/00 |
| 2011/0316636 A1 | 12/2011 | Zhao | |
| 2013/0187712 A1 | 7/2013 | Cabanillas | |
| 2013/0207739 A1* | 8/2013 | Bakalski | H04B 1/18 |
| | | | 333/33 |
| 2013/0326300 A1* | 12/2013 | Suzuki | H03H 11/30 |
| | | | 327/389 |
| 2014/0104132 A1 | 4/2014 | Bakalski | |

(Continued)

FOREIGN PATENT DOCUMENTS

CN 105897236 A 8/2016

OTHER PUBLICATIONS

Office action dated Aug. 25, 2022 for CN application No. 202010938802.2, pp. 1-8, dated Aug. 25, 2022.

*Primary Examiner* — Patricia T Nguyen
(74) *Attorney, Agent, or Firm* — Winston Hsu

(57) ABSTRACT

A matching circuit includes an input terminal, an output terminal, a first impedance component, a first set of switching devices, a second impedance component, a second set of switching devices and a controller. The first impedance component includes a first terminal coupled between the input terminal and the output terminal, and a second terminal. The first set of switching devices is coupled to the second terminal of the first impedance component, the controller and a reference terminal. The second impedance component includes a first terminal coupled between the second terminal of the first impedance component and the first set of switching devices, and a second terminal. The second set of switching devices is coupled to the second terminal of the second impedance component, the controller and the reference terminal. The controller controls the first set of switch devices and the second set of switch devices according to a detection signal.

19 Claims, 5 Drawing Sheets

(56) References Cited

U.S. PATENT DOCUMENTS

| | | | |
|---|---|---|---|
| 2016/0141882 A1* | 5/2016 | Ichikawa | H04B 5/0037 |
| | | | 307/104 |
| 2017/0104469 A1* | 4/2017 | Mavretic | H04B 1/44 |
| 2019/0097583 A1* | 3/2019 | Chamas | H03F 3/45242 |

* cited by examiner

MATCHING CIRCUIT

CROSS REFERENCE TO RELATED APPLICATION

This non-provisional application claims priority of Taiwan patent application No. 109125409, filed on 28 Jul. 2020, included herein by reference in its entirety.

TECHNICAL FIELD

The invention relates to matching circuits, and specifically, to a matching circuit for use in a radio frequency (RF) communications system.

BACKGROUND

In a communication system, RF signals are used to carry data for wireless transmission. The RF signal will be transmitted from a signal source to an electrical load prior to a wireless transmission. However, since the output impedance of the signal source and the input impedance of the electrical load may be different, the RF signal will be reflected when transmitted owing to impedance mismatch, resulting in power loss. Therefore, the matching circuit is inserted between the signal source and the electrical load to reduce the reflection of the RF signal and achieve the maximum power transmission.

The conventional matching circuit uses multiple parallel capacitor branches, and provides multiple impedances by selecting one or more capacitor branches from the multiple parallel capacitor branches. However, in order to effectively isolate the unselected capacitor branches, the conventional matching circuit employs equal quantities of stacked transistors in the capacitor branches. As a result, the size of the matching circuit is difficult to reduce, and the manufacturing cost remains high.

SUMMARY

According to an embodiment of the invention, a matching circuit includes an input terminal, an output terminal, a first impedance component, a first set of switching devices, a second impedance component, and a second set of switching devices. The first impedance component comprises a first terminal coupled between the input terminal and the output terminal, and a second terminal. The first set of switching devices includes a first terminal coupled to the second terminal of the first impedance component, a second terminal coupled to a reference terminal, and a plurality of control terminals. The second impedance component includes a first terminal coupled between the second terminal of the first impedance component and the first terminal of the first set of switching devices, and a second terminal. The second set of switching devices includes a first terminal coupled to the second terminal of the second impedance component, a second terminal coupled to the reference terminal, and a plurality of control terminals. The controller is coupled to the plurality of control terminals of the first set of switching devices and the plurality of control terminals of the second set of switching devices, and is used to control the first set of switching devices and the second set of switching devices according to a detection signal. The first set of switching devices includes a plurality of first transistors coupled in series, and the second set of switching devices includes a plurality of second transistors coupled in series. The number of first transistors is different from the number of second transistors.

DETAILED DESCRIPTION

Figure 1:
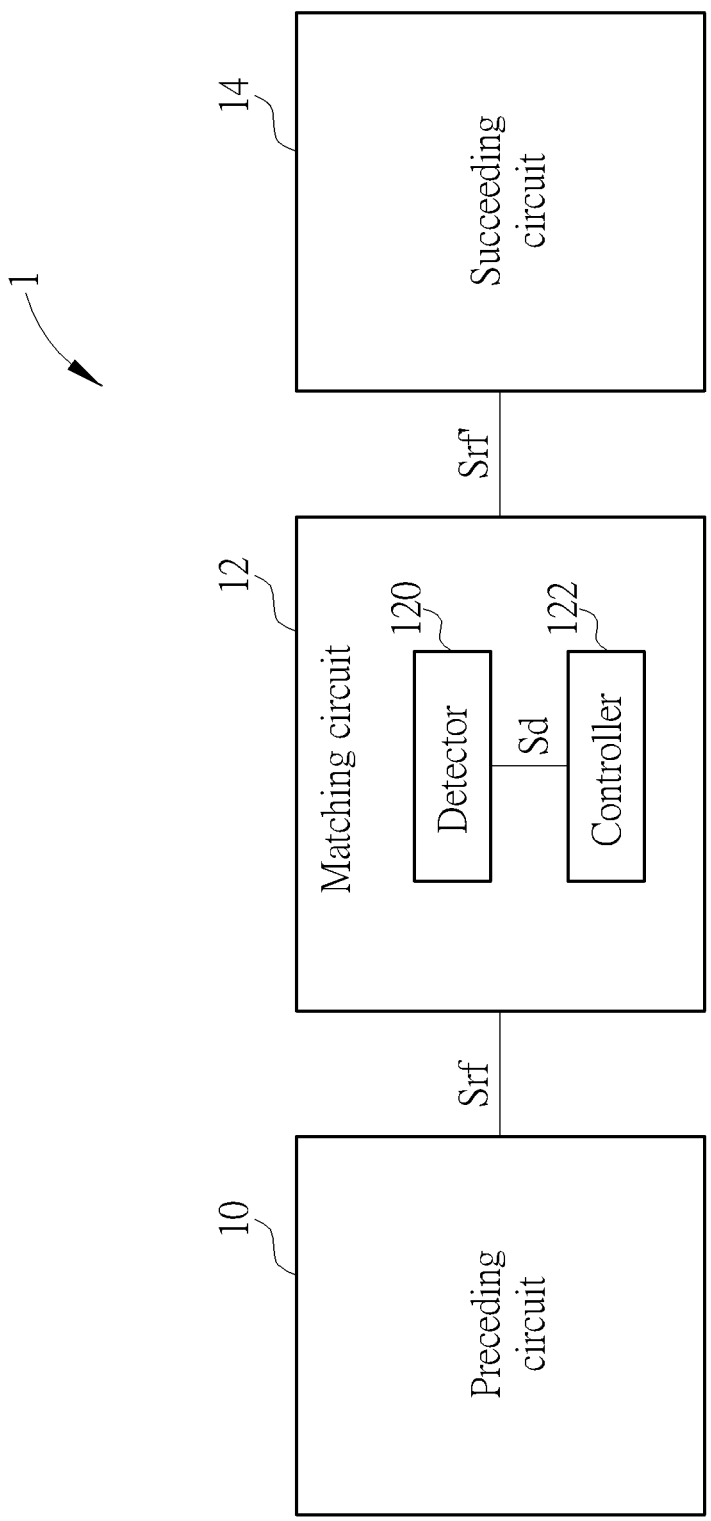
FIG. 1 is a block diagram of a radio frequency circuit according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like components throughout.

FIG. 1 is a block diagram of a radio frequency (RF) circuit 1 according to an embodiment of the invention. The RF circuit 1 may operate on RF signals and may include a preceding circuit 10, a matching circuit 12 and a succeeding circuit 14. The matching circuit 12 may be coupled to the preceding circuit 10 and the succeeding circuit 14.

The preceding circuit 10 and the succeeding circuit 14 may be a power amplifier, a low noise amplifier, an antenna, or other radio frequency circuits. For example, if the RF circuit 1 is a transmitter, the preceding circuit 10 may be a power amplifier and the succeeding circuit 14 may be an antenna, and if the RF circuit 1 is a receiver, the preceding circuit 10 may be an antenna and the succeeding circuit 14 may be a low noise amplifier. The preceding circuit 10 may output an input signal Srf to the matching circuit 12, and the matching circuit 12 may output an output signal Srf' to the succeeding circuit 14. The input signal Srf and the output signal Srf' may be RF signals.

The matching circuit 12 may be tuned into different modes to provide a plurality of possible impedances according to an electrical property measured from the input signal Srf and/or the preceding circuit 10. The electrical property may be the frequency of the input signal Srf, the power of the input signal Srf, the phase of the input signal Srf, the output impedance of the preceding circuit 10, and/or the temperature of the preceding circuit 10, or the like.

The matching circuit 12 may include a detector 120 and a controller 122 coupled thereto. The detector 120 may detect the electrical property to generate a detection signal Sd. The controller 122 may control the matching circuit 12 to provide a suitable impedance according to the detection signal Sd, so as to generate the output signal Srf' according to the input signal Srf, and transfer the output signal Srf' to the succeeding circuit 14.

Figure 2:
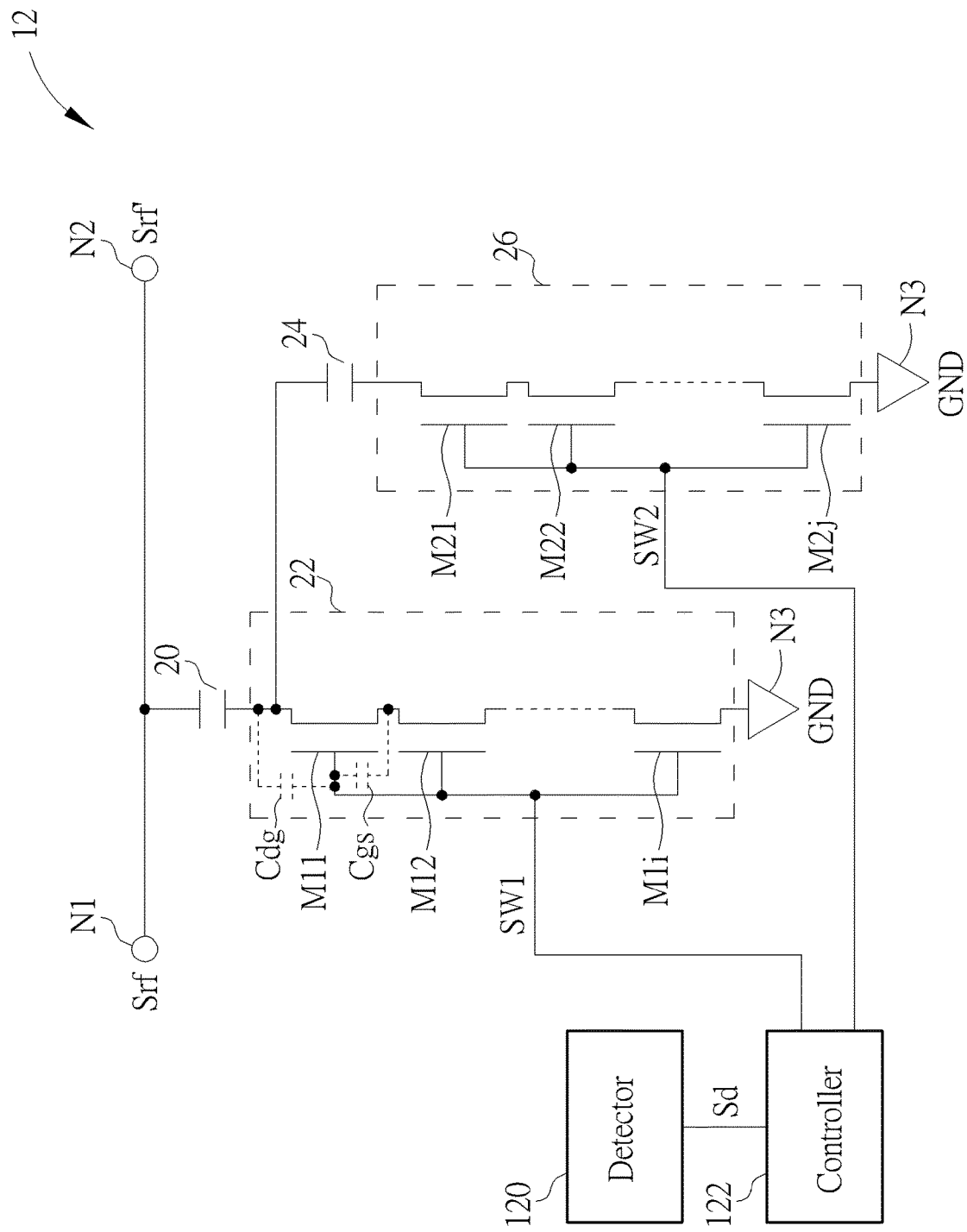
FIG. 2 is a block diagram of an embodiment of the matching circuit in FIG. 1.

FIG. 2 is a block diagram of an embodiment of the matching circuit 12. The matching circuit 12 may provide several capacitances, and one of the capacitances may be selected therefrom. The matching circuit 12 may include the detector 120, the controller 122, an input terminal N1, an output terminal N2, a capacitor 20, a first set of switching devices 22, a capacitor 24 and a second set of switching devices 26. The input terminal N1 may be coupled to the signal source, and the output terminal N2 may be coupled to the load. The capacitor 20 may include a first terminal coupled between the input terminal N1 and the output terminal N2, and a second terminal. The first set of switching devices 22 may include a first terminal coupled to the second terminal of the capacitor 20, a second terminal coupled to a reference terminal N3, and a plurality of control terminals. The reference terminal N3 may provide a reference voltage GND, such as 0V or another fixed voltage. The capacitor 24 may include a first terminal coupled to the second terminal of the capacitor 20 and the first terminal of the first set of switching devices 22, and a second terminal. The second set of switching devices 26 may include a first terminal coupled to the second terminal of the capacitor 24, a second terminal coupled to the reference terminal N3, and a plurality of control terminals. The controller 122 may be coupled to the plurality of control terminals of the first set of switching devices 22 and the plurality of control terminals of the second set of switching devices 26.

The capacitor 20 may have a capacitance C1, and the capacitor 24 may have a capacitance C2. The capacitances C1 and C2 may be identical or different. For example, the capacitance C1 may be a, and the capacitance C2 may be 2a.

The first set of switching devices 22 may include a plurality of first transistors M11 to M1$i$ coupled in series, i being the number of first transistors M11 to M1$i$, and i being a positive integer. The first set of switch devices 12 may control coupling between the second terminal of the capacitor 20 and the reference terminal N3 according to a control signal SW1. The control signal SW1 may be set to an enabling level or a disabling level. When the control signal SW1 is set to the enabling level, the first transistors M11 to M1$i$ may be turned on couple the second terminal of the capacitor 20 to the reference terminal N3. When the control signal SW1 is set to the disabling level, the first transistors M11 to M1$i$ may be turned off to isolate the second terminal of the capacitor 20 from the reference terminal N3. The enabling level may be a high level, such as 0.7V, and the disabling level may be a low level, such as 0V. The second set of switching devices 26 may include a plurality of second transistors M21 to M2$j$ coupled in series, j being the number of second transistors M21 to M2$j$, and j being a positive integer. The second set of switch devices 26 may control coupling between the second terminal of the capacitor 24 and the reference terminal N3 according to a control signal SW2. The control signal SW2 may be set to an enabling level or a disabling level. When the control signal SW2 is set to the enabling level, the second transistors M21 to M2$j$ may be turned on to couple the second terminal of the capacitor 24 to the reference terminal N3. When the control signal SW2 is set to the disabling level, the second transistors M21 to M2$j$ may be turned off to isolate the second terminal of the capacitor 24 from the reference terminal N3. The first transistors M11 to M1$i$ and the second transistors M21 to M2$j$ may be N-type metal-oxide-semiconductor field-effect transistors (MOSFETs) of equal size. In some embodiments, the first transistors M11 to M1$i$ and the second transistors M21 to M2$j$ may be P-type MOSFETs of equal size, the enabling level may be a low level, and the disabling level may be a high level.

Since each of the first transistors M11 to M1$i$ has a parasitic capacitance Cdg between the drain and the gate, and has a parasitic capacitance Cgs between the gate and the source, it is possible that the voltage of the input signal Srf will be coupled to the reference terminal N3 via the first capacitor 20, the respective parasitic capacitances Cdg, and the respective parasitic capacitances Cgs of the first transistors M11 to M1$i$, even if the control signal SW1 is set to the disabling level. If the number i of the first transistors M11 to M1$i$ is insufficient and/or the voltage amplitude of the input signal Srf is too large, the voltage may be coupled via the capacitor 20, the respective parasitic capacitances Cdg, and the respective parasitic capacitances Cgs of the first transistors M11 to M1$i$ to the reference terminal N3. As such, the respective voltage differences between the gates and the sources of the first transistors M11 to M1$i$ may exceed the threshold voltage, so that the first transistors M11 to M1$i$ may not be substantially turned off, and the second terminal of the capacitor 20 may not be substantially isolated from the reference terminal N3. Therefore, the number i of the first transistors M11 to M1$i$ must be sufficiently large to substantially isolate the second terminal of the capacitor 20 from the reference terminal N3. For example, when the power of the input signal Srf is 36 dBm, the number i may be set to 12 to substantially isolate the second terminal of the capacitor 20 from the reference terminal N3 when the control signal SW1 is set to the disabling level. The number i may be positively correlated to the maximum voltage from the second terminal of the capacitor 20 to the reference terminal N3 during operation of the matching circuit 12. For example, when the maximum voltage is 4V, the number i may be 12, and when the maximum voltage is (4/3)V, the number i may be 4 (=12/3). For example, the number i of the first transistors M11 to M1$i$ and the number j of the second transistors M21 to M2$j$ may be identical or different. In some embodiments, the capacitance C2 of the capacitor 24 could be greater than the capacitance C1 of the capacitor 20, e.g., C2=10*C1, the number i of the first transistors M11 to M1$i$ may be selected to equal the number j of the second transistors M21 to M2$j$. In other embodiments, the number i of the first transistors M11 to M1$i$ may be larger than the number j of the second transistors M21 to M2$j$. For example, when the capacitance C1 is "a" and the capacitance C2 is "2a", the number i may be 4 and the number j may be 1. In some embodiments, the second set of switching devices 26 may be used to provide more accurate impedance matching. In other embodiments, the second set of switching devices 26 may be selectively removed from the matching circuit 12 so that the capacitor 24 may be coupled to the reference terminal N3 to further reduce the area of the matching circuit 12.

According to states of the first set of switching devices 22 and the second set of switching devices 26, the matching circuit 12 may be set in a first mode or a second mode, respectively, so as to provide a corresponding equivalent capacitance, as shown in Table 1:

TABLE 1

| | The first set of switching devices 22 | The second set of switching devices 26 | Equivalent capacitance |
|---|---|---|---|
| First mode | Off | On | $(1/C1 + 1/C2)^{-1}$ |
| Second mode | On | On/off | C1 |

In the first mode, the controller 122 may turn off the first set of switching devices 22, and turn on the second set of switching devices 26, so as to couple the capacitor 20 and 24 in series and to enable the matching circuit 12 to provide a first equivalent capacitance $(1/C1+1/C2)^{-1}$. The equivalent capacitance in the first mode may be derived from the capacitance C1 and C2. For example, when the capacitance C1 is "a" and the capacitance C2 is "2a", the equivalent capacitance of the first mode may be "(2/3)a".

In the second mode, the controller 122 may turn on the first set of switching devices 22, and turn on or off the second set of switching devices 26, so as to couple the capacitor 20 to the reference node N3 and to enable the matching circuit 12 to provide the equivalent capacitance C1 in the second mode. For example, when the capacitance C1 is "a", the equivalent capacitance of the second mode may be "a". The equivalent capacitance (a) in the second mode is greater than the equivalent capacitance ((2/3)a) in the first mode.

The detection signal Sd may correspond to different modes, such as a first mode or a second mode. The controller 122 may generate the control signal SW1 and the control signal SW2 according to the detection signal Sd, control the first set of switching devices 22 using the control signal SW1, and, control the second set of switching devices 26 using the control signal SW2.

In some embodiments, the detector 120 may detect the frequency of the input signal Srf, and generate the detection signal Sd according to the frequency of the input signal Srf. In some embodiments, the controller 122 may select a higher equivalent capacitance for a higher frequency of the input signal Srf, and select a lower equivalent capacitance for a lower frequency of the input signal Srf. If the detection signal Sd indicates that the frequency of the input signal Srf is lower than a frequency threshold, the controller 122 may control the first set of switching devices 22 and the second set of switching devices 26 to operate in the first mode. If the detection signal Sd indicates that the frequency of the input signal Srf is higher than the frequency threshold, the controller 122 may control the first set of switching devices 22 and the second set of switching devices 26 to operate in the second mode. Accordingly, the equivalent capacitance in the second mode is greater than the equivalent capacitance in the first mode. Since an impedance (Z) of a capacitor is inversely proportional to a capacitance (C) thereof for a given frequency (f), that is, $Z=1/(j*2\pi f*C)$, the equivalent impedance of a shunt path of the matching circuit 12 in the second mode is less than that in the first mode, and an operation frequency in the second mode is higher than the first mode. The matching circuit 12 may serve as a variable resonator to pass frequency components near the operation frequency in the input signal Srf, and attenuate frequency components away from the operation frequency in the input signal Srf. In this way, the, the succeeding circuit 14 does not need to further process the output signal Srf' and the circuit complexity of the subsequent stage circuit 14 is hence reduced. The amount of attenuation of the frequency component could increase with the distance between the frequency component and the operation frequency. A frequency further away from the operation frequency will be attenuated further. In some embodiments, the frequency component to be attenuated may be at a frequency higher or lower than the operation frequency. For example, the operation frequency may be 5 GHz in the second mode, frequency components at 6 GHz and 2.5 GHz may be attenuated, and a frequency component at 5 GHz may pass the matching circuit 12, resulting in the output signal Srf' including the frequency component at 5 GHz but not the frequency components at 2.5 GHz and 6 GHz. Similarly, the operation frequency may be 4.5 GHz in the first mode, the frequency components at 6 GHz and 2.5 GHz may be attenuated, and a frequency component at 4.5 GHz may pass the matching circuit 12, resulting in the output signal Srf' including the frequency component at 4.5 GHz but not the frequency components at 2.5 GHz and 6 GHz.

In other embodiments, the controller 122 may select a higher equivalent capacitance for a lower frequency of the input signal Srf, and select a lower equivalent capacitance for a higher frequency of the input signal Srf. If the detection signal Sd indicates that the frequency of the input signal Srf is higher than a frequency threshold, the controller 122 may control the first set of switching devices 22 and the second set of switching devices 26 to operate in the first mode. If the detection signal Sd indicates that the frequency of the input signal Srf is lower than the frequency threshold, the controller 122 may control the first set of switching devices 22 and the second set of switching devices 26 to operate in the second mode. Since an impedance (Z) of a capacitor is inversely proportional to a product of a capacitance (C) of the capacitor and a frequency (f) of a signal, that is, $Z=1/(j*2\pi f*C)$, selecting a lower equivalent capacitance for a high-frequency input signal Srf and a higher equivalent capacitance for a low-frequency input signal Srf may ensure that the impedance of the matching network 12 is substantially constant and independent of the frequency of the input signal Srf, and may be suitable for transmitting a broadband input signal Srf between the preceding circuit 10 and the succeeding circuit 14. As a result, utilizing the matching network 12 according to the embodiment may deliver a wider operating frequency range.

In some embodiments, the input signal Srf may be substantially constant in frequency, and the detector 120 may detect the power of the input signal Srf, and generate the detection signal Sd according to the power of the input signal Srf. The controller 122 may select a higher equivalent capacitance for a higher power input signal Srf and a lower equivalent capacitance for a lower power input signal Srf. If the detection signal Sd indicates that the power of the input signal Srf is lower than a power threshold, the controller 122 may control the first set of switching devices 22 and the second set of switching devices 26 to operate in the first mode. If the detection signal Sd indicates that the power of the input signal Srf is higher than the power threshold, the controller 122 may control the first set of switching devices 22 and the second set of switching devices 26 to operate in the second mode. For a higher power of the input signal Srf, the lower equivalent impedance in the second mode may provide more attenuation to the input signal Srf; and for a lower power of the input signal Srf, the higher equivalent impedance in the first mode may provide less attenuation to the input signal Srf, thereby keeping the power of the output signal Srf' substantially constant.

In some embodiments, the input signal Srf may be substantially constant in frequency, and the detector 120 may detect the phase of the input signal Srf, and generate the detection signal Sd according to the phase of the input signal Srf. The controller 122 may select a higher equivalent capacitance for a leading phase of the input signal Srf and a lower equivalent capacitance for a lagging phase of the input signal Srf. If the detection signal Sd indicates that the phase of the input signal Srf leads that of a reference signal, the controller 122 may control the first set of switching devices 22 and the second set of switching devices 26 to operate in the second mode. If the detection signal Sd indicates that the power of the input signal Srf lags that of the reference signal, the controller 122 may control the first set of switching devices 22 and the second set of switching devices 26 to operate in the first mode. The reference signal may be generated by internal or external circuits. For example, an oscillator may be used. For the leading phase of the input signal Srf, the lower equivalent impedance in the second mode may cancel the excessive phase lead of the input signal Srf; and for the lagging phase of the input signal Srf, the higher equivalent impedance in the first mode may cancel the excessive phase lag of the input signal Srf', thereby keeping the phase of the output signal Srf' substantially constant.

In some embodiments, the input signal Srf may be substantially constant in frequency, and the detector 120 may detect the output impedance of the preceding circuit 10 and generate the detection signal Sd according to the output impedance of the preceding circuit 10. The controller 122 may select a higher equivalent capacitance for a lower output impedance of the preceding circuit 10 and a lower equivalent capacitance for a higher output impedance of the preceding circuit 10. If the detection signal Sd indicates that the output impedance of the preceding circuit 10 is lower than an impedance threshold, the controller 122 may control the first set of switching devices 22 and the second set of switching devices 26 to operate in the second mode. If the detection signal Sd indicates that the output impedance of the preceding circuit 10 is higher than the impedance threshold, the controller 122 may control the first set of switching devices 22 and the second set of switching devices 26 to operate in the first mode. For the lower output impedance (R1) of the preceding circuit 10, the higher equivalent capacitance (Ch) of the matching circuit 12 in the second mode may produce a time constant ($\tau=R1*Ch$) of the matching circuit 12, and for the higher output impedance (Rh) of the preceding circuit 10, the lower equivalent impedance value (C1) of the matching circuit 12 in the first mode may produce the time constant ($\tau=Rh*C1$) of the matching circuit 12, thereby keeping the delay of the output signal Srf' substantially constant.

In some embodiments, the input signal Srf may remain substantially constant in frequency, and the detector 120 may detect the temperature of the preceding circuit 10, and generate the detection signal Sd according to the temperature of the preceding circuit 10. The preceding circuit 10 may be a power amplifier, and the gain of the power amplifier decreases with an increase in temperature, i.e., the higher the temperature is, the lower the gain will be. Therefore, the controller 122 may select a higher equivalent capacitance for a lower temperature of the preceding circuit 10, and select a lower equivalent capacitance for a higher temperature of the preceding circuit 10. If the detection signal Sd indicates that the temperature of the preceding circuit 10 is lower than a temperature threshold, the controller 122 may control the first set of switching devices 22 and the second set of switching devices 26 to operate in the second mode. If the detection signal Sd indicates that the temperature of the preceding circuit 10 is higher than the temperature threshold, the controller 122 may control the first set of switching devices 22 and the second set of switching devices 26 to operate in the first mode. For a lower temperature of the preceding circuit 10, the lower equivalent impedance of the shunt path in the second mode may provide more attenuation to the input signal Srf; and for a higher temperature of the preceding circuit 10, the higher equivalent impedance of the shunt path in the first mode may provide less attenuation to the input signal Srf, resulting in a substantially constant power of the output signal Srf'.

In some embodiments, the first mode may correspond to a first frequency, the second mode may correspond to a second frequency, and/or the second frequency is higher than the first frequency. For example, the first frequency may be 2.3 GHz, and the second frequency may be 2.4 GHz. When the input signal Srf is 2.3 GHz, the matching circuit 12 may be set in the first mode to perform impedance matching for the input signal Srf at 2.3 GHz. When the input signal Srf is 2.4 GHz, the matching circuit 12 may be set in the second mode to perform impedance matching for the input signal Srf at 2.4 GHz. In other embodiments, the operation mode of the matching circuit 12 may be set with respect to the output impedance of the preceding circuit of the matching circuit 12. For example, the output impedance of the preceding circuit may be an "on" impedance or an "off" impedance. When the output impedance of the preceding circuit is equal to the "on" impedance, the matching circuit 12 may be set in the first mode to perform impedance matching for the "on" impedance. When the output impedance of the preceding circuit is equal to the "off" impedance, the matching circuit 12 may be set in the second mode to perform impedance matching for the "off" impedance. In another embodiment, the operation mode of the matching circuit 12 may also be set with respect to the input impedance of the succeeding circuit of the matching circuit 12.

The matching circuit 12 may control the isolation between the second terminal of the capacitor 20 and the reference terminal N3 by using the first transistors M11 to M1$i$, and control the isolation between the second terminal of the capacitor 24 and the reference terminal N3 by using the second transistors M21 to M2$j$. Since the maximum voltage between the second terminal of the capacitor 24 and the reference terminal N3 is less than the maximum voltage between the second terminal of the capacitor 20 and the reference terminal N3, and the number j of the second transistors M21 to M2$j$ is less than the number i of the first transistors M11 to M1$i$. Compared to the methods in the art in which different matching impedances are generated by selecting from a plurality of parallel-connected capacitor branches, the total number of transistors (i+j) in the matching circuit 12 is less, reduce the area of the matching circuit 12, and reduce the manufacturing costs. In addition, compared to the matching circuit in the art, since the total number of transistors (i+j) of the matching circuit 12 is reduced, an equivalent resistance equal to that of a conventional matching circuit may be achieved if the sizes of the transistors of the first transistor M11 to M1$i$ and the second transistors M21 to M2$j$ are reduced, further reducing the area of the matching circuit 12.

Figure 3:
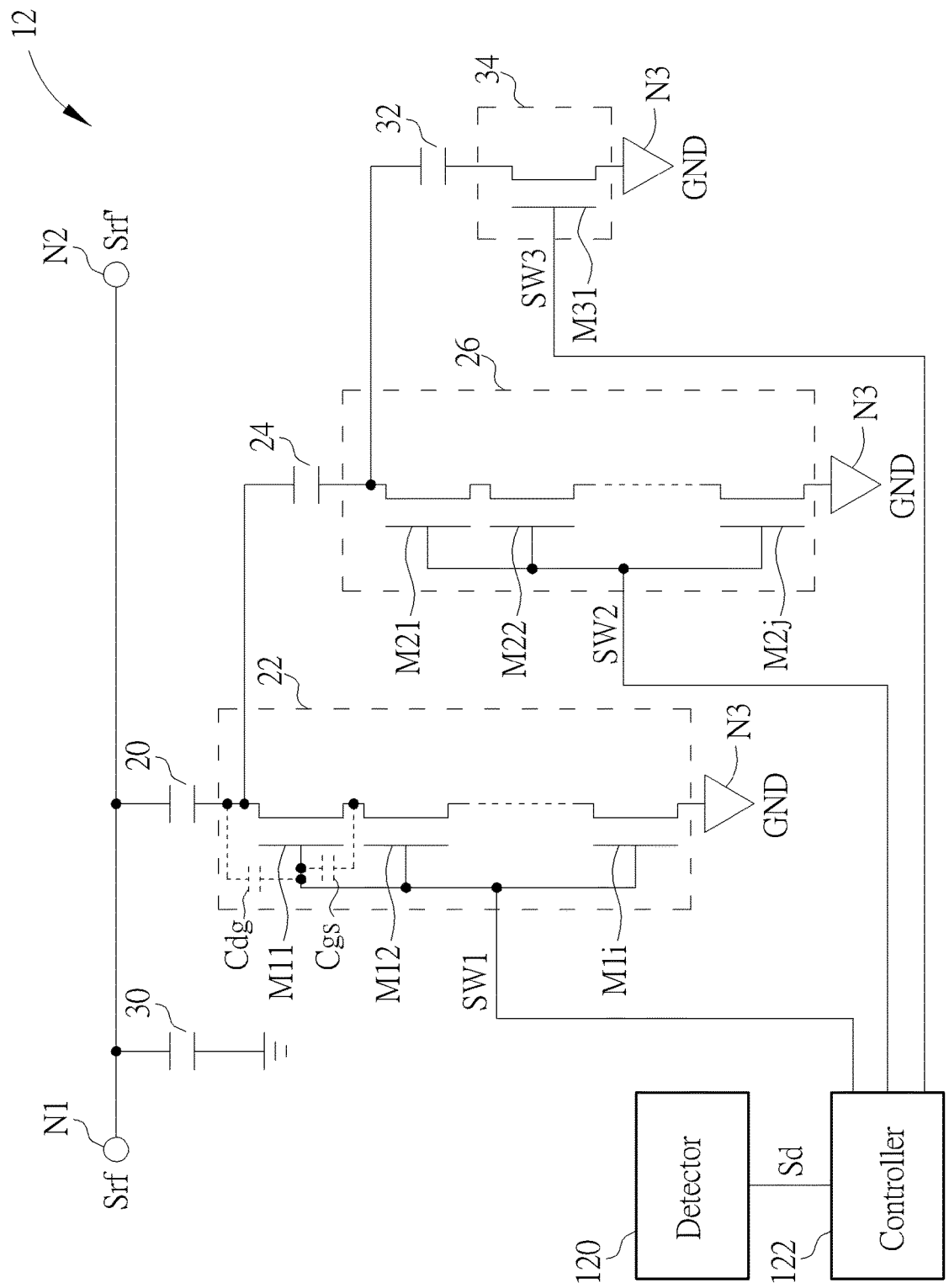
FIG. 3 is a block diagram of another embodiment of the matching circuit in FIG. 1.

FIG. 3 is a block diagram of another embodiment of the matching circuit 12. The main difference between the matching circuit 12 and the matching circuit 12 lies in that the matching circuit 12 further includes a capacitor 30, a capacitor 32 and a third set of switching devices 34. The operations of the capacitor 30, the capacitor 32 and the third set of switching devices 34 are explained as follows.

The capacitor 30 may include a first terminal coupled to the input terminal N1, and a second terminal coupled to the reference terminal N3. The capacitor 32 may include a first terminal coupled between the second terminal of the capacitor 24 and the first terminal of the second set of switching devices 26, and a second terminal. The third set of switching devices 34 may include a first terminal coupled to the second terminal of the capacitor 32, a second terminal coupled to the reference terminal N3, and a control terminal. The controller 122 may further be coupled to the control terminals of the third set of switching devices 34.

The capacitor 30 may have a capacitance "b", and the capacitor 32 may have a capacitance C3. The capacitance "b" may be greater than the capacitances C1 to C3. The capacitances C1 to C3 may be the equal or different. For example, the capacitance C1 may be "a", the capacitance C2 may be "2a", and the capacitance C3 may be "(2/3)a".

The third set of switching devices 34 may include a third transistor M31. In some embodiments, the third set of switching devices 34 may include third transistors M31 to M3$k$, k being the number of third transistors M31 to M3$k$ and $k$ being a positive integer. The number i of the first transistors M11 to M1$i$ and/or the number j of the second transistors M21 to M2$j$ may be greater than the number k of the third transistors M31 to M3$k$. In some embodiments, the third set of switching devices 34 may be used to provide more accurate impedance matching. In other embodiments, the third set of switching devices 34 may be selectively removed from the matching circuit 12 to enable the second terminal of the capacitor 32 to be coupled to the reference terminal N3, thereby further reducing the area of the matching circuit 12. Taking FIG. 3 as an example, the third set of switching devices 34 includes a third transistor M31. The third set of switching devices 34 may control the coupling between the second terminal of the capacitor 32 and the reference terminal N3 according to the control signal SW3. The control signal SW3 may be set to an enabling level or a disabling level. When the control signal SW3 is set to the enabling level, the third transistor M31 may be turned on to couple the second terminal of the capacitor 32 to the reference terminal N3. When the control signal SW3 is set to the disabling level, the third transistor M31 may be turned off to isolate the second terminal of the capacitor 32 from the reference terminal N3. The third transistor M31, the first transistors M11 to M1$i$, and the second transistors M21 to M2$j$ may be N-type MOSFETs of equal size. In some embodiments, the third transistor M31, the first transistors M11 to M1$i$, and the second transistors M21 to M2$j$ may be P-type MOSFETs of the same size.

According to the states of the first set of switching devices 22, the second set of switching devices 26 and the third set of switching devices 34, the matching circuit 12 may be set in the third mode, the fourth mode or the fifth mode, respectively providing the corresponding equivalent capacitances as in table 2:

TABLE 2

|  | The first set of switching devices 22 | The second set of switching devices 26 | The third set of switching devices 34 | Equivalent capacitance |
|---|---|---|---|---|
| The third mode | Off | Off | On | $b + (1/C1 + 1/C2 + 1/C3)^{-1}$ |
| The fourth mode | Off | On | On/off | $b + (1/C1 + 1/C2)^{-1}$ |
| The fifth mode | On | On/off | On/off | $b + C1$ |

In the third mode, the controller 122 may turn off the first set of switching devices 22, turn off the second set of switching devices 26, and turn on the third set of switching devices 34, so as to couple the capacitors 20, 24 and 32 in series and to enable the matching circuit 12 to provide the equivalent capacitance $b+(1/C1+1/C2+1/C3)^{-1}$ in the third mode. The equivalent capacitance in the third mode may be derived according to the capacitances "b", C1, C2, and C3. For example, when the capacitance C1 is "a", the capacitance C2 is "2a", and the capacitance C3 is "(2/3)a", the equivalent capacitance of the third mode may be "b+(1/3)a".

In the fourth mode, the controller 122 may turn off the first set of switching devices 22 may be turned off, turn on the second set of switching devices 26, and turn on or off the third set of switching devices 34, so as to configure the capacitors 20 and 24 in series and to enable the matching circuit 12 to provide the equivalent capacitance b+(1/C1+1/C2)$^{-1}$ in the fourth mode. The equivalent capacitance in the fourth mode may be derived according to the capacitances "b", C1 and C2. For example, when the capacitance C1 is "a" and the capacitance C2 is "2a", the equivalent capacitance of the fourth mode may be "b+(2/3)a". The equivalent capacitance (b+(2/3)a) in the fourth mode is greater than the equivalent capacitance (b+(1/3)a) in the third mode.

In the fifth mode, the controller 122 may turn on the first set of switching devices 22 may be turned on, turn on or off the second set of switching devices 26, and turn on or off the third set of switching devices 34, so as to enable the matching circuit 12 to provide the equivalent capacitance "b+C1" in the fifth mode. For example, when the capacitance C1 is "a", the equivalent capacitance in the fifth mode may be "b+a". The equivalent capacitance (b+a) in the fifth mode is greater than the equivalent capacitance (b+(2/3)a) in the fourth mode. When the first set of switching devices 22 is turned on, regardless of whether the second set of switching devices 26 and the third set of switching devices 34 are turned on or off, the matching circuit 12 may generate an equivalent capacitance (b+a).

In some embodiments, the capacitances C1, C2 and C3 are sequentially decreasing in value (C1>C2>C3), then the matching circuit 12 may provide a wider range of equivalent capacitances than a case in which the capacitances C1, C2 and C3 are sequentially increasing in value (C1<C2<C3). In the case of the sequentially decreasing capacitances C1, C2 and C3, the equivalent capacitance in the third mode is less than and most close to the capacitance C3, or the equivalent capacitance in the third mode is dominant by the capacitance C3. In one example, the capacitances C1 is 10 pF, the capacitances C2 is 4 pF and the capacitances C3 is 1 pF, then the equivalent capacitance is 10 pF in the fifth mode, the equivalent capacitance is 2.8 pF in the fourth mode and the equivalent capacitance is 0.74 pF in the third mode, the matching circuit 12 may provide equivalent capacitances ranging between 0.74 pF to 10 pF. In comparison, in the case of the sequentially increasing capacitances C1, C2 and C3, the capacitances C1 may be 1 pF, the capacitances C2 may be 4 pF and the capacitances C3 may be 10 pF, the matching circuit 12 may only provide equivalent capacitances ranging between 0.74 pF to 1 pF.

The detection signal Sd may correspond to different mode, such as, correspond to the third mode, the fourth mode, or the fifth mode. The controller 122 may further generate the control signal SW3, and control the third set of switching devices 34 using the control signal SW3. Similar to the matching network 12 in FIG. 2, the matching network 12 in FIG. 3 may be configured into various modes according to the electrical properties.

In some embodiments, the detector 120 may detect the frequency of the input signal Srf, and generate the detection signal Sd according to the frequency of the input signal Srf. In some embodiments, the controller 122 may select a higher equivalent capacitance for a higher frequency of the input signal Srf, and select a lower equivalent capacitance for a lower frequency of the input signal Srf. If the detection signal Sd indicates that the frequency of the input signal Srf is lower than a low frequency threshold, the controller 122 may control the first set of switching devices 22, the second set of switching devices 26 and the third set of switching devices 34 to operate in the third mode. If the detection signal Sd indicates that the frequency of the input signal Srf is between the low frequency threshold and a high frequency threshold, the controller 122 may control the first set of switching devices 22, the second set of switching devices 26 and the third set of switching devices 34 to operate in the fourth mode. The high frequency threshold is higher than the low frequency threshold. If the detection signal Sd indicates that the frequency of the input signal Srf is higher than the high frequency threshold, the controller 122 may control the first set of switching devices 22, the second set of switching devices 26 and the third set of switching devices 34 to operate in the fifth mode. The equivalent impedance of the matching circuit 12 in the fifth mode is less than that of the fourth mode, and the equivalent impedance of the matching circuit 12 in the fourth mode is less than that of the third mode, and therefore, an operation frequency in the fifth mode is higher than the fourth mode, and an operation frequency in the fourth mode is higher than the third mode. For example, the operation frequency may be 5 GHz in the fifth mode, 4.5 GHz in the fourth mode, and 4 GHz in the third mode. The matching circuit 12 may transfer frequency components near the operation frequency of a selected mode and filter out frequency components away from the operation frequency of the selected mode. In this way, the, the subsequent stage circuit 14 does not need to further process the output signal Srf' and the circuit complexity of the subsequent stage circuit 14 is hence reduced.

In other embodiments, the controller 122 may select a higher equivalent capacitance for a lower frequency of the input signal Srf, select an intermediate equivalent capacitance for an intermediate frequency of the input signal Srf, and select a lower equivalent capacitance for a higher frequency of the input signal Srf. If the detection signal Sd indicates that the frequency of the input signal Srf is higher than a higher frequency threshold, the controller 122 may control the first set of switching devices 22, the second set of switching devices 26 and the third set of switching devices 34 to operate in the third mode. If the detection signal Sd indicates that the frequency of the input signal Srf is between the high frequency threshold and a low frequency threshold, the controller 122 may control the first set of switching devices 22, the second set of switching devices 26 and the third set of switching devices 34 to operate in the fourth mode. The higher frequency threshold is higher than the lower frequency threshold. If the detection signal Sd indicates that the frequency of the input signal Srf is lower than the low frequency threshold, the controller 122 may control the first set of switching devices 22, the second set of switching devices 26 and the third set of switching devices 34 to operate in the fifth mode. Since an impedance (Z) of a capacitor is inversely proportional to a product of a capacitance (C) of the capacitor and a frequency (f) of a signal, that is, $Z=1/(j*2\pi f*C)$, selecting a lower equivalent capacitance for a high-frequency input signal Srf, and a higher equivalent capacitance for a low-frequency input signal Srf may ensure that the impedance of the matching network 12 is substantially constant and independent of the frequency of the input signal Srf, and may be suitable for transmitting a broadband input signal Srf between the preceding circuit 10 and the succeeding circuit 14.

In some embodiments, the input signal Srf may be substantially constant in frequency, and the detector 120 may detect the power of the input signal Srf, and generate the detection signal Sd according to the power of the input signal Srf. The controller 122 may select a higher equivalent capacitance for a higher power of the input signal Srf and a lower equivalent capacitance for a lower power of the input signal Srf. If the detection signal Sd indicates that the power of the input signal Srf is lower than a low power threshold, the controller 122 may control the first set of switching devices 22, the second set of switching devices 26 and the third set of switching devices 34 to operate in the third mode. If the detection signal Sd indicates that the power of the input signal Srf is between the low power threshold and a high power threshold, the controller 122 may control the first set of switching devices 22, the second set of switching devices 26, and the third set of switching devices 34 to operate in the fourth mode. The high power threshold is higher than the low power threshold. If the detection signal Sd indicates that the power of the input signal Srf is higher than the higher power threshold, the controller 122 may control the first set of switching devices 22, the second set of switching devices 26 and the third set of switching devices 34 to operate in the fifth mode. For the higher power of the input signal Srf, the lower equivalent impedance in the fifth mode may provide more attenuation to the input signal Srf; and for the lower power of the input signal Srf, the higher equivalent impedance in the third mode may provide less attenuation to the input signal Srf, thereby keeping the power of the output signal Srf' substantially constant.

In some embodiments, the input signal Srf may be substantially constant in frequency, and the detector 120 may detect the phase of the input signal Srf, and generate the detection signal Sd according to the phase of the input signal Srf. The controller 122 may select a higher equivalent capacitance for a leading phase of the input signal Srf and a lower equivalent capacitance for a lagging phase of the input signal Srf. If the detection signal Sd indicates that the phase of the input signal Srf leads a reference signal by more than a first phase angle, the controller 122 may control the first set of switching devices 22, the second set of switching devices 26, and the third set of switching devices 34 to operate in the fifth mode. If the detection signal Sd indicates that the phase of the input signal Srf leads the reference signal by less than the first phase angle or the phase of the input signal Srf lags the reference signal by less than the second phase angle, the controller 122 may control the first set of switching devices 22, the second set of switching devices 26 and the third set of switching devices 34 to operate in the fourth mode. If the detection signal Sd indicates that the phase of the input signal Srf lags the reference signal by more than the second phase angle, the controller 122 may control the first set of switching devices 22, the second set of switching devices 26, and the third set of switching devices 34 to operate in the third mode. The reference signal may be generated by an internal or external circuit, e.g., by an oscillator. For the leading phase of the input signal Srf, the lower equivalent impedance in the fifth mode may cancel the excessive phase lead of the input signal Srf; and for the lagging phase of the input signal Srf, the higher equivalent impedance in the third mode may cancel the excessive phase lag of the input signal Srf, thereby keeping the phase of the output signal Srf' substantially constant.

In some embodiments, the input signal Srf may be substantially constant in frequency, and the detector 120 may detect the output impedance of the preceding circuit 10 and generate the detection signal Sd according to the output impedance of the preceding circuit 10. The controller 122 may select a higher equivalent capacitance for a lower output impedance of the preceding circuit 10, an intermediate equivalent capacitance for an intermediate output impedance of the preceding circuit 10, and a lower equivalent capacitance for a higher output impedance of the preceding circuit 10. If the detection signal Sd indicates that the output impedance of the preceding circuit 10 is lower than a low impedance threshold, the controller 122 may control the first set of switching devices 22, the second set of switching devices 26, and the third set of switching devices 34 to operate in the fifth mode. If the detection signal Sd indicates that the output impedance of the preceding circuit 10 is between the low impedance threshold and a high impedance threshold, the controller 122 may control the first set of switching devices 22, the second set of switching devices 26, and the third set of switching devices 34 to operate in the fourth mode. The high impedance threshold is higher than the low impedance threshold. If the detection signal Sd indicates that the output impedance of the preceding circuit 10 is higher than the high impedance threshold, the controller 122 may control the first set of switching devices 22, the second set of switching devices 26, and the third set of switching devices 34 to operate in the third mode. For the lower output impedance (R1) of the preceding circuit 10, the higher equivalent capacitance (Ch) of the matching circuit 12 in the fifth mode may produce a time constant ($\tau$=R1*Ch) of the matching circuit 12, and for the higher output impedance (Rh) of the stage circuit 10, the lower equivalent impedance (Cl) of the matching circuit 12 in the third mode may produce the time constant ($\tau$=Rh*Cl) of the matching circuit 12, thereby keeping the delay of the output signal Srf' substantially constant.

In some embodiments, the input signal Srf may remain substantially constant in frequency, and the detector 120 may detect the temperature of the preceding circuit 10, and generate the detection signal Sd according to the temperature of the preceding circuit 10. The preceding circuit 10 may be a power amplifier, and the gain of the power amplifier decreases with an increase in temperature, i.e., the higher the temperature is, the lower the gain will be. Therefore, the controller 122 may select a higher equivalent capacitance for a lower temperature of the preceding circuit 10, select an intermediate equivalent capacitance for an intermediate temperature of the preceding circuit 10, and select a lower equivalent capacitance for a higher temperature of the preceding circuit 10. If the detection signal Sd indicates that the temperature of the preceding circuit 10 is lower than a low temperature threshold, the controller 122 may control the first set of switching devices 22, the second set of switching devices 26 and the third set of switching devices 34 to operate in the fifth mode. If the detection signal Sd indicates that the temperature of the preceding circuit 10 is between the low temperature threshold and a high temperature threshold, the controller 122 may control the first set of switching devices 22, the second set of switching devices 26 and the third set of switching devices 34 to operate in the fourth mode. The high temperature threshold is higher than the low temperature threshold. If the detection signal Sd indicates that the temperature of the preceding circuit 10 is higher than the high temperature threshold, the controller 122 may control the first set of switching devices 22, the second set of switching devices 26 and the third set of switching devices 34 to operate in the third mode. For a lower temperature of the preceding circuit 10, the lower equivalent impedance of the shunt path in the fifth mode may provide more attenuation to the input signal Srf; and for a higher temperature of the preceding circuit 10, the higher equivalent impedance of the shunt path in the third mode may provide less attenuation to the input signal Srf, resulting in a substantially constant power of the output signal Srf'.

In some embodiments, the third mode corresponds to a first frequency, the fourth mode corresponds to a second frequency, and the fifth mode corresponds to a third frequency. The third frequency is different from the second frequency, for example, higher than the second frequency. The second frequency is different from the first frequency. For example, the first frequency may be 2.3 GHz, the second frequency may be 2.4 GHz, and the third frequency may be 2.5 GHz. When the input signal Srf is 2.3 GHz, the matching circuit 12 may be set to the third mode to perform impedance matching for input signal Srf at the 2.3 GHz. When the input signal Srf is 2.4 GHz, the matching circuit 12 maybe set to the fourth mode to perform impedance matching for the input signal Srf at 2.4 GHz; and when the input signal Srf is 2.5 GHz, the matching circuit 12 may be set to the fifth mode to perform impedance matching for the input signal Srf at 2.5 GHz. In other embodiments, the operation mode of the matching circuit 12 may also be set with respect to the output impedance of the preceding circuit of the matching circuit 12.

Although the matching circuit 12 selects from three impedance branches of the capacitor 20 and the first set of switching devices 22, the capacitor 24 and the second set of switching devices 26, and the capacitor 32 and the third set of switching devices 34 to provide three equivalent capacitances, in other embodiments of the present invention, other numbers of impedance branches may be used according to the same principle and all impedance branches may be selected to provide other numbers of equivalent capacitances.

Compared to the method in the art in which different matching impedances are generated by selecting from a plurality of parallel-connected capacitor branches, the total number of transistors (i+j+k) in the matching circuit 12 is less, thereby reducing the size of the transistors, reducing the area of the matching circuit 12, and/or reducing the manufacturing costs.

Figure 4:
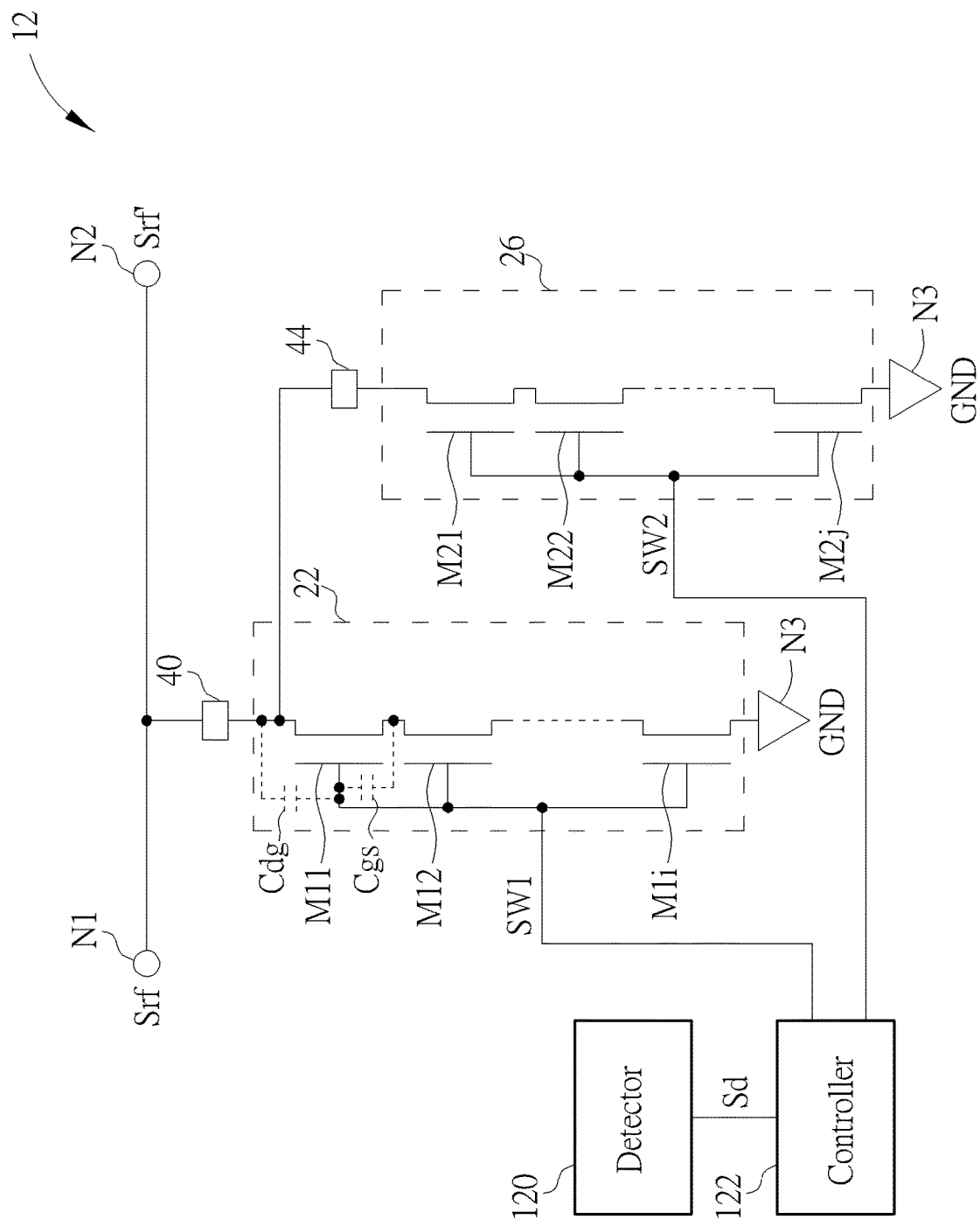
FIG. 4 is a block diagram of another embodiment of the matching circuit in FIG. 1.

Although the matching circuit 1 and the matching circuit 12 of the foregoing embodiment are described with capacitors 20, 24, 30, and 32, in other embodiments of the invention, other impedance components such as resistors or inductors may be used in place of the capacitors. FIG. 4 is a block diagram of another embodiment of the matching circuit 12. The main difference between the matching circuit 12 and the matching circuit 1 is that the capacitor 30 and the capacitor 24 are replaced by an impedance component 40 and an impedance component 44 respectively. The matching circuit 12 may include the input terminal N1, the output terminal N2, the impedance component 40, the first set of switching devices 22, the impedance component 44, and the second set of switching devices 26. The input terminal N1 may be coupled to a signal source, and the output terminal N2 may be coupled to a load. The impedance component 40 may include a first terminal coupled between the input terminal N1 and the output terminal N2, and a second terminal. The first set of switching devices 22 may include a first terminal coupled to the second terminal of the impedance component 40, a second terminal coupled to a reference terminal N3, and a plurality of control terminals coupled to the controller 122. The reference terminal N3 may provide the reference voltage GND. The impedance component 44 may include a first terminal coupled between the second terminal of the impedance component 40 and the first terminal of the first set of switching devices 22, and a second terminal. The second set of switching devices 26 may include the first terminal coupled to the second terminal of the impedance component 44, the second terminal coupled to the reference terminal N3, and a plurality of control terminals coupled to the controller 122. The first set of switching devices 22 may include the plurality of first transistors M11 to M1$i$ coupled in series, the second set of switching devices 26 may include the plurality of second transistors M21 to M2$j$ coupled in series, and the number i of the plurality of first transistors M11 to M1$i$ is different from the number j of the plurality of second transistors M21 to M2$j$. In the first mode, the first set of switching devices 22 is turned off to enable the matching circuit 12 to provide a first equivalent matching impedance. In the second mode, the first set of switching devices 22 is turned on to enable the matching circuit 12 to provide a second equivalent matching impedance. The second equivalent matching impedance is different from the first equivalent matching impedance.

Figure 5:
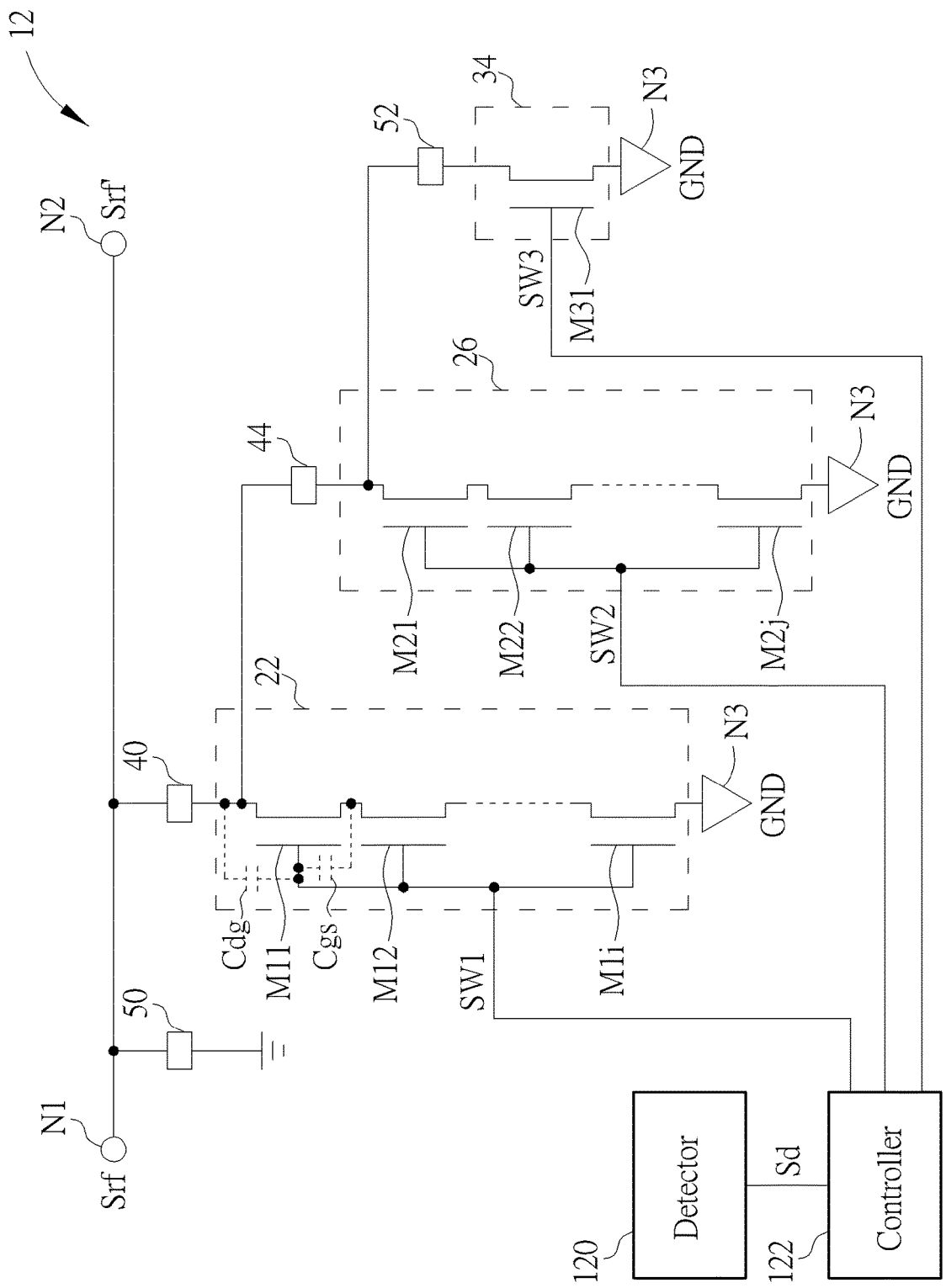
FIG. 5 is a block diagram of another embodiment of the matching circuit in FIG. 1.

FIG. 5 is a block diagram of another embodiment of the matching circuit 12. The main difference between the matching circuits 12 in FIGS. 3 and 5 is that the capacitor 20, the capacitor 24, the capacitor 32, and the capacitor 30 in FIG. 3 are replaced by the impedance component 40, the impedance component 44, an impedance component 52, and an impedance component 50 in FIG. 5, respectively. The impedance component 50 may include a first terminal coupled to the input terminal N1, and a second terminal coupled to the reference terminal N3. The impedance component 52 may include a first terminal coupled between the second terminal of the impedance component 44 and the first terminal of the second set of switching devices 26, and a second terminal. The third set of switching devices 34 may include a first terminal coupled to the second terminal of the impedance component 52, a second terminal coupled to the reference terminal N3, and a control terminal coupled to the controller 122. The third set of switching devices 34 may include at least one third transistor M31 or a plurality of third transistors M31 to M3$k$ coupled in series. The number i of the plurality of first transistors M11 to M1$i$, the number j of the plurality of second transistors M21 to M2$j$ and the number k of the plurality of third transistors M31 to M3$k$ may all be different. In the third mode, the first set of switching devices 22 and the second set of switching devices 26 may be turned off, and the third set of switching devices 34 may be turned on to enable the matching circuit 12 to provide a first equivalent capacitance. In the fourth mode, the first set of switching devices 22 may be turned off and the second set of switching devices 26 may be turned on to enable the matching circuit 12 to provide a second equivalent matching impedance. In the fifth mode, the first set of switching devices 22 may be turned on to enable the matching circuit 12 to provide a third equivalent matching impedance. The first equivalent matching impedance, the second equivalent matching impedance, and the third equivalent matching impedance are all different. The impedance components can be, for example, capacitive components, resistive components, inductive components or a combination thereof, to achieve the effects of the foregoing embodiments.

The matching circuit 12 in FIGS. 2 to 5 may measure electrical properties of a circuit, and provide an appropriate impedance according to the properties of the circuit, thereby filtering out unwanted frequency components in the input signal Srf, providing a wideband transmission, maintaining a substantially constant power output, maintaining a substantially constant phase, and/or maintaining a substantially constant output delay.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A matching circuit comprising:
   an input terminal and an output terminal;
   a first impedance component comprising a first terminal coupled between the input terminal and the output terminal, and a second terminal;
   a first set of switching devices comprising a first terminal coupled to the second terminal of the first impedance component, a second terminal coupled to a reference terminal, and a plurality of control terminals;
   a second impedance component comprising a first terminal coupled between the second terminal of the first impedance component and the first terminal of the first set of switching devices, and a second terminal;
   a second set of switching devices comprising a first terminal coupled to the second terminal of the second impedance component, a second terminal coupled to the reference terminal, and a plurality of control terminals; and
   a controller, coupled to the plurality of control terminals of the first set of switching devices and the plurality of control terminals of the second set of switching devices, and configured to control the first set of switching devices and the second set of switching devices according to a detection signal;
   wherein the first set of switching devices comprises a plurality of first transistors coupled in series, the second set of switching devices comprises a plurality of second transistors coupled in series, a quantity of the first transistors is different from a quantity of the second transistors;
   the detection signal corresponds to a first mode or a second mode;
   in the first mode, the controller is configured to turn off the first set of switching devices to enable the matching circuit to provide a first equivalent capacitance; and
   in the second mode, the controller is configured to turn on the first set of switching devices to enable the matching circuit to provide a second equivalent capacitance, the second equivalent capacitance being higher than the first equivalent capacitance.

2. The matching circuit of claim 1, further comprising a detector coupled to the controller, and configured to detect a frequency of an input signal, and generate the detection signal according to the frequency of the input signal.

3. The matching circuit of claim 1, further comprising a detector coupled to the controller, and configured to detect a power of an input signal, and generate the detection signal according to the power of the input signal.

4. The matching circuit of claim 1, further comprising a detector coupled to the controller, and configured to detect a phase of an input signal, and generate the detection signal according to the phase of the input signal.

5. A matching circuit comprising:
an input terminal and an output terminal;
a first impedance component comprising a first terminal coupled between the input terminal and the output terminal, and a second terminal;
a first set of switching devices comprising a first terminal coupled to the second terminal of the first impedance component, a second terminal coupled to a reference terminal, and a plurality of control terminals;
a second impedance component comprising a first terminal coupled between the second terminal of the first impedance component and the first terminal of the first set of switching devices, and a second terminal;
a second set of switching devices comprising a first terminal coupled to the second terminal of the second impedance component, a second terminal coupled to the reference terminal, and a plurality of control terminals;
a controller, coupled to the plurality of control terminals of the first set of switching devices and the plurality of control terminals of the second set of switching devices, and configured to control the first set of switching devices and the second set of switching devices according to a detection signal; and
a detector coupled to the controller, and configured to detect an output impedance of a preceding circuit, and generate the detection signal according to the output impedance of the preceding circuit;
wherein the first set of switching devices comprises a plurality of first transistors coupled in series, the second set of switching devices comprises a plurality of second transistors coupled in series, a quantity of the first transistors is different from a quantity of the second transistors.

6. A matching circuit comprising:
an input terminal and an output terminal;
a first impedance component comprising a first terminal coupled between the input terminal and the output terminal, and a second terminal;
a first set of switching devices comprising a first terminal coupled to the second terminal of the first impedance component, a second terminal coupled to a reference terminal, and a plurality of control terminals;
a second impedance component comprising a first terminal coupled between the second terminal of the first impedance component and the first terminal of the first set of switching devices, and a second terminal;
a second set of switching devices comprising a first terminal coupled to the second terminal of the second impedance component, a second terminal coupled to the reference terminal, and a plurality of control terminals;
a controller, coupled to the plurality of control terminals of the first set of switching devices and the plurality of control terminals of the second set of switching devices, and configured to control the first set of switching devices and the second set of switching devices according to a detection signal; and a detector coupled to the controller, and configured to detect a temperature of a preceding circuit, and generate the detection signal according to the temperature of the preceding circuit;
wherein the first set of switching devices comprises a plurality of first transistors coupled in series, the second set of switching devices comprises a plurality of second transistors coupled in series, a quantity of the first transistors is different from a quantity of the second transistors.

7. The matching circuit of claim 1, wherein the first impedance component and the second impedance component are capacitors.

8. The matching circuit of claim 1, wherein the quantity of first transistors exceeds the quantity of second transistors.

9. The matching circuit of claim 1, further comprising:
a third impedance component comprising a first terminal coupled to the input terminal, and a second terminal coupled to the reference terminal.

10. The matching circuit of claim 9, wherein the third impedance component is a capacitor.

11. The matching circuit of claim 1, further comprising a third impedance component comprising a first terminal coupled between the second terminal of the second impedance component and the first terminal of the second set of switching devices, and a second terminal.

12. The matching circuit of claim 11, wherein the first impedance component, the second impedance component and the third impedance component are capacitors.

13. The matching circuit of claim 12, wherein:
the detection signal further corresponds to a third mode, a fourth mode or a fifth mode;
in the third mode, the controller is configured to turn off the first set of switching devices and the second set of switching devices to enable the matching circuit to provide a third equivalent capacitance;
in the fourth mode, the controller is configured to turn off the first set of switching devices and turn on the second set of switching devices to enable the matching circuit to provide a fourth equivalent capacitance, the fourth equivalent capacitance being higher than the third equivalent capacitance; and
in the fifth mode, the controller is configured to turn on the first set of switching devices to enable the matching circuit to provide a fifth equivalent capacitance, the fifth equivalent capacitance being higher than the fourth equivalent capacitance.

14. The matching circuit of claim 13, wherein:
in the fifth mode, the controller is further configured to turn off the second set of switching devices to enable the matching circuit to provide the fifth equivalent capacitance.

15. The matching circuit of claim 13, wherein:
in the fifth mode, the controller is further configured to turn on the second set of switching devices to enable the matching circuit to provide the fifth equivalent capacitance.

16. The matching circuit of claim 11, wherein:
the second terminal of the third impedance component is coupled to the reference terminal.

17. The matching circuit of claim 11, wherein:
the second terminal of the third impedance component is coupled to a third set of switching devices.

18. The matching circuit of claim 17, wherein the first set of switching devices comprises a plurality of first transistors coupled in series, the second set of switching devices comprises a plurality of second transistors coupled in series, the third set of switching devices comprises at least one third transistor, a quantity of the plurality of first transistors or a quantity of the plurality of second transistors is greater than a quantity of the at least one third transistor.

19. The matching circuit of claim 17, wherein the first set of switching devices comprises a plurality of first transistors coupled in series, the second set of switching devices comprises a plurality of second transistors coupled in series, the third set of switching devices comprises at least one third transistor, and a quantity of the plurality of first transistors and a quantity of the plurality of second transistors are both greater than a quantity of the at least one third transistor.

\* \* \* \* \*